United States Patent
Qiu et al.

(10) Patent No.: US 9,606,204 B2
(45) Date of Patent: Mar. 28, 2017

(54) MAGNETIC RESONANCE MULTI-CORE ARRAY RADIO FREQUENCY DEVICE AND MAGNETIC RESONANCE SIGNAL RECEIVING METHOD

(71) Applicant: SHENZHEN INSTITUTES OF ADVANCED TECHNOLOGY CHINESE ACADEMY OF SCIENCES, Guangdong (CN)

(72) Inventors: Bensheng Qiu, Guangdong (CN); Yibiao Song, Guangdong (CN); Yongqin Zhang, Guangdong (CN); Hui Miao, Guangdong (CN); Xin Liu, Guangdong (CN); Hairong Zheng, Guangdong (CN)

(73) Assignee: Shenzhen Institutes of Advanced Technology Chinese Academy of Sciences, Guangdong (CN)

(*) Notice: Subject to any disclaimer, the term of this patent is extended or adjusted under 35 U.S.C. 154(b) by 491 days.

(21) Appl. No.: 14/364,711

(22) PCT Filed: Nov. 14, 2012

(86) PCT No.: PCT/CN2012/084588
§ 371 (c)(1),
(2) Date: Jun. 12, 2014

(87) PCT Pub. No.: WO2013/086918
PCT Pub. Date: Jun. 20, 2013

(65) Prior Publication Data
US 2014/0361775 A1    Dec. 11, 2014

(30) Foreign Application Priority Data
Dec. 12, 2011  (CN) .......................... 2011 1 0412142

(51) Int. Cl.
*G01V 3/00* (2006.01)
*G01R 33/36* (2006.01)
*G01R 33/3415* (2006.01)

(52) U.S. Cl.
CPC ..... *G01R 33/3621* (2013.01); *G01R 33/3614* (2013.01); *G01R 33/3628* (2013.01); *G01R 33/3664* (2013.01); *G01R 33/3415* (2013.01)

(58) Field of Classification Search
CPC ............ G01R 33/3621; G01R 33/3614; G01R 33/3664; G01R 33/3415
(Continued)

(56) References Cited

U.S. PATENT DOCUMENTS

| 8,344,731 B2* | 1/2013 | Lee ........................ G01N 24/08 324/309 |
| 8,542,017 B2* | 9/2013 | Aerts ...................... A61B 5/05 324/309 |

(Continued)

FOREIGN PATENT DOCUMENTS

| CN | 1815487 A | 8/2006 |
| CN | 101073017 A | 11/2007 |

(Continued)

*Primary Examiner* — Susan Lee
(74) *Attorney, Agent, or Firm* — Rosenberg, Klein & Lee (57) ABSTRACT

A magnetic resonance multi-core array radio frequency device and a magnetic resonance signal receiving method are provided. The device comprises a radio frequency receiver which includes a radio frequency coil (11), a low noise preamplifier (13), a multiplexer (15), a radio frequency band-pass filter (17), a program control amplifier (19), a frequency synthesizer (21), a mixer (23), an analog to digital converter (29) and a controller (31). The controller (31) is used for controlling the multiplexer (15) to select a corresponding radio frequency coil channel, a corresponding filtering channel, gain of the radio frequency band-pass filter (17), and receiving a magnetic resonance digital signal (Continued)

transmitted by the analog to digital converter (29). Due to the multiplexer (15), there is no need to configure different circuits respectively for different nuclear magnetic resonance, redundancy of the circuits is reduced, and cost is reduced.

13 Claims, 3 Drawing Sheets (58) Field of Classification Search
USPC .......................................................... 324/309
See application file for complete search history.

(56) References Cited

U.S. PATENT DOCUMENTS

| | | |
|---|---|---|
| 2008/0169816 A1 | 7/2008 | Festag et al. |
| 2009/0230966 A1 | 9/2009 | Ehnholm |
| 2012/0081115 A1* | 4/2012 | Reykowski ........ G01R 33/3415 324/309 |
| 2012/0283546 A1* | 11/2012 | Zuehlsdorff ........... A61B 5/055 600/410 |
| 2013/0342207 A1* | 12/2013 | Keupp ............... G01R 33/3614 324/309 |
| 2014/0361775 A1 | 12/2014 | Qiu et al. |

FOREIGN PATENT DOCUMENTS

| | | |
|---|---|---|
| CN | 101226231 A | 7/2008 |
| CN | 101594163 A | 12/2009 |
| CN | 102565733 A | 7/2012 |
| WO | 00/28343 A1 | 5/2000 |
| WO | 2010/146487 A1 | 12/2010 |

* cited by examiner

MAGNETIC RESONANCE MULTI-CORE ARRAY RADIO FREQUENCY DEVICE AND MAGNETIC RESONANCE SIGNAL RECEIVING METHOD

FIELD OF THE INVENTION

The present invention relates to a field of magnetic resonance radio frequency, and more particularly relates to a magnetic resonance multi-core array radio frequency device and a magnetic resonance signal receiving method.

BACKGROUND OF THE INVENTION

A radio frequency device is an important component of the magnet resonance imaging equipment. It excites polarized nucleuses (such as 1H, 19F) in an object using radio frequency pulses transmitted by different radio frequency pulse sequences, so as to generate a plurality of magnetic resonance (MR) signals, and receive the MR signals.

Classified by functions, the radio frequency device includes radio frequency receiver and radio frequency transmitter. The radio frequency receiver is generally composed of a plurality of circuit units, such as receiving coil, preamplifier, local oscillator, mixer, filter, A/D converter (analog to digital converter), modem, and coupler, etc; the radio frequency transmitter is generally composed of a plurality of circuit units, such as D/A converter (digital to analog converter), power amplifier, attenuator, transmitting coil, and transmit/receive switch, etc. The receiver plays a role of amplifying and collecting magnetic resonance signals, and its performance directly determines a signal-to-noise ratio of a magnetic resonance spectroscopy.

A conventional receiver receives signals by cooperating with a plurality of array coils, and configures a same circuit to each channel, separately. This manner reduces the workload of the receiving system, while leaves a great redundancy on the signal processing ability of the receiving system. When the channels increase to a certain number, such simple repeatedly received circuit will make the whole receiving system extremely expensive and cumbersome.

SUMMARY OF THE INVENTION

Accordingly, it is necessary to provide an economical magnetic resonance multi-core array radio frequency device.

A magnetic resonance multi-core array radio frequency device includes a radio frequency receiver. The radio frequency receiver includes a plurality of radio frequency coils configured to capture a magnetic resonance signal; a low noise amplifier electrically connected to the radio frequency coils, and configured to pre-amplify the magnetic resonance signal captured by the radio frequency coils; a multiplexer electrically connected to the low noise amplifier, and configured to provide a corresponding radio frequency coil channel and a corresponding filter channel, and transmit the magnetic resonance signal pre-amplified by the low noise amplifier; a radio frequency band-pass filter electrically connected to the multiplexer, and configured to filter the magnetic resonance signal; a programmable gain amplifier electrically connected to the radio frequency band-pass filter, and configured to amplify the magnetic resonance signal; a frequency synthesizer configured to generate a local oscillator signal; a mixer electrically connected to the programmable gain amplifier and the frequency synthesizer, and configured to mix the magnetic resonance signal and the local oscillator signal; an A/D converter electrically connected to the mixer, and configured to convert the magnetic resonance signal mixed by the mixer into a magnetic resonance digital signal; and a controller electrically connected to the multiplexer, the radio frequency band-pass filter, the frequency synthesizer, and the A/D converter, respectively. The controller is configured to control the multiplexer to select the corresponding radio frequency coil channel and the corresponding filter channel, to control a gain of the radio frequency band-pass filter, to control the frequency synthesizer to generate the local oscillator signal and receive the magnetic resonance digital signal transmitted by the A/D converter.

In an embodiment, the frequency synthesizer is further configured to generate a radio frequency pulse signal, and the magnetic resonance multi-core array radio frequency device further includes a buffer amplifier electrically connected to the frequency synthesizer, and configured to buffer amplify the radio frequency pulse signal; a power amplifier electrically connected to the buffer amplifier, and configured to amplify the radio frequency pulse signal; a power detector electrically connected to the power amplifier and the controller, and configured to adjust a power of the radio frequency pulse signal; and a transmit/receive switch, one end of the transmit/receive switch is connected to the radio frequency coils, and the other end of the transmit/receive switch is connected to the low noise amplifier and the power detector, respectively. The radio frequency coils are further configured to transmit the radio frequency pulse signal. The frequency synthesizer, the buffer amplifier, the power amplifier, the power detector, the transmit/receive switch, and the radio frequency coils cooperatively form a radio frequency transmitter.

In an embodiment, the multiplexer includes a coil channel selecting radio frequency multiplexer electrically connected to the low noise amplifier, configured to provide the radio frequency coil channel, and a filter channel selecting radio frequency multiplexer configured to provide the filter channel. An input terminal of the filter channel selecting radio frequency multiplexer is electrically connected to the coil channel selecting radio frequency multiplexer, and an output terminal of the filter channel selecting radio frequency multiplexer is electrically connected to the radio frequency band-pass filter.

In an embodiment, the number of the radio frequency band-pass filter is multiple, each input terminal of each radio frequency band-pass filter is electrically connected to the filter channel selecting radio frequency multiplexer, and each output terminal of each radio frequency band-pass filter is electrically connected to the programmable gain amplifier.

In an embodiment, the number of the low noise amplifier is multiple, each low noise amplifier is disposed between each channel of the coil channel selecting radio frequency multiplexer and the radio frequency coils.

In an embodiment, the radio frequency coils are selected from the group consisting of multichannel phased array coils, combined coils, body coils, and tunable radio frequency coils.

In an embodiment, the magnetic resonance multi-core array radio frequency device further includes an intermediate frequency band-pass filter electrically connected to the mixer, and configured to filter the magnetic resonance signal mixed by the mixer, and a general amplifier configured to amplify the magnetic frequency signal. An input terminal of the general amplifier is electrically connected to the intermediate frequency band-pass filter, and an output terminal of the general amplifier is electrically connected to the A/D converter.

Furthermore, it is also necessary to provide a magnetic resonance signal receiving method.

A method of receiving magnetic resonance signal includes the following steps: capturing a magnetic resonance signal by a radio frequency coil; pre-amplifying the magnetic resonance signal by a low noise amplifier; selecting a corresponding radio frequency coil channel of a multiplexer and a corresponding filter channel according to the magnetic resonance signal and transmitting the magnetic resonance signal; filtering and amplifying the magnetic resonance signal; obtaining a local oscillator signal, and mixing the local oscillator signal and the magnetic resonance signal; and converting the mixed magnetic resonance signal into a digital signal, and obtaining a magnetic resonance digital signal.

In an embodiment, prior to the step of capturing a magnetic resonance signal by a radio frequency coil, the method further includes configuring a transmit/receive switch to a receive state.

In an embodiment, after the step of obtaining a local oscillator signal, and mixing the local oscillator signal and the magnetic resonance signal, the method further includes filtering and amplifying the mixed magnetic resonance signal.

In the magnetic resonance multi-core array radio frequency device and the magnetic resonance signal receiving method, a multiplexer is configured to select a corresponding radio frequency coil channel and a corresponding filter channel, while other circuits are communal, so it is not necessary to configure different circuits for different magnetic resonance nucleuses, which reduces the redundancy of the circuits, and cuts the cost.

DETAILED DESCRIPTION OF THE EMBODIMENTS

The invention will be described in detail with the following embodiments and drawings.

Figure 1:
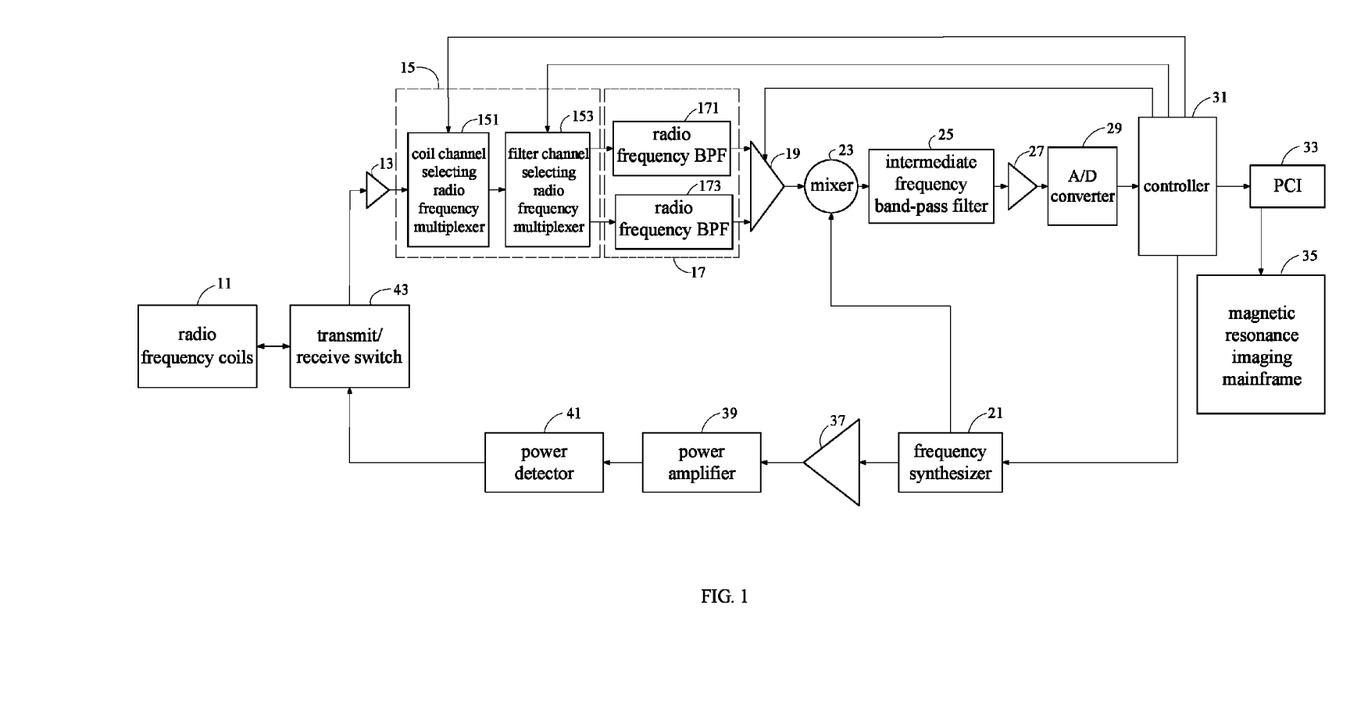
FIG. 1 is a block diagram of a magnetic resonance multi-core array radio frequency device in accordance with an embodiment.

Referring to FIG. 1, in an embodiment, a magnetic resonance multi-core array radio frequency device includes a radio frequency receiver and a radio frequency transmitter.

The radio frequency receiver includes a plurality of radio frequency coils 11, a low noise amplifier 13, a multiplexer 15, a radio frequency band-pass filter 17, a programmable gain amplifier 19, a frequency synthesizer 21, a mixer 23, an intermediate frequency band-pass filter 25, a general amplifier 27, an A/D converter 29, and a controller 31.

The radio frequency coils 11 are configured to capture a magnetic resonance signal.

In the illustrated embodiment, the radio frequency coils 11 are receiving and transmitting terminals of the magnetic resonance multi-core array radio frequency device. The radio frequency coils 11 may be multichannel phased array coils, combined coils, or body coils. Alternatively, the radio frequency coils 11 may also be radio frequency coils that can be automatically tuned according to different nucleuses imaging or radio frequency coils that can be tuned according to different field intensities.

The low noise amplifier 13 is electrically connected to the radio frequency coils 11, and is configured to pre-amplify the captured magnetic resonance signal.

In particular, the gain of the low noise amplifier (LNA) is 30 DB, the noise figure thereof is 0.5 DB, and a magnetic resonance signal in milliamps level is amplified, which facilitates the following circuit processing. The low noise amplifier 13 is tightly connected to the radio frequency coils 11. In the illustrated embodiment, the radio frequency receiver includes multiple low noise amplifiers 13, each channel of the multiplexer 15 and each radio frequency coil provide with one low noise amplifier 13 therebetween.

The multiplexer 15 is electrically connected to the low noise amplifier 13, and it is configured to provide a corresponding radio frequency coil channel and a corresponding filter channel, and transmit the pre-amplified magnetic resonance signal.

For example, the multiplexer 15 may be an 8-to-1 multiplexer of Mini-Circuits Co. Ltd, whose rise time and fall time is 3 ns. Each low noise amplifier 13 is independently shielded. The eight branches of the multiplexer 15 are also electromagnetically shielded, independently, so as to avoid the electromagnetic interference and the coupling therebetween.

In the illustrated embodiment, the multiplexer 15 includes a coil channel selecting radio frequency multiplexer 151 and a filter channel selecting radio frequency multiplexer 153.

The coil channel selecting radio frequency multiplexer 151 is electrically connected to the low noise amplifier 13, and is configured to provide the radio frequency coil channel.

The filter channel selecting radio frequency multiplexer 153 is configured to provide the filter channel, an input terminal thereof is electrically connected to the coil channel selecting radio frequency multiplexer 151, and an output terminal thereof is electrically connected to the radio frequency band-pass filter 17.

In addition, the controller 31 controls the coil channel selecting radio frequency multiplexer 151 to select a radio frequency coils channel corresponding to the magnetic resonance signal, and controls the filter channel selecting radio frequency multiplexer 153 to select a filter channel corresponding to the magnetic resonance signal.

The radio frequency band-pass filter (BPF) 17 is electrically connected to the multiplexer 15, and is configured to filter the magnetic resonance signal.

Specifically, the radio frequency band-pass filter 17 is generally configured to eliminate the noise, and avoid a spectrum aliasing during sampling. In the illustrated embodiment, a surface-mount BPF of Mini-Circuits Co. Ltd is used to obtain a band-pass filtering of 120 MHZ and 128 MHZ, respectively, and the bandwidth of the surface-mount BPF is 1 MHZ. In an embodiment, the radio frequency receiver includes multiple radio frequency band-pass filters 17. Each input terminal of each radio frequency band-pass filter 17 is electrically connected to the filter channel selecting radio frequency multiplexer 153, and each output terminal of each radio frequency band-pass filter 17 is electrically connected to the programmable gain amplifier 19. In the illustrated embodiment, the radio frequency band-pass filter 17 includes a radio frequency band-pass filter 171 for filtering a 1H nucleus, and a radio frequency band-pass filter 173 for filtering a 19F nucleus.

The programmable gain amplifier (PGA) 19 is electrically connected to the radio frequency band-pass filter 17, and is configured to amplify the magnetic resonance signal.

In the illustrated embodiment, the programmable gain amplifier (PGA) is an AD8369 of Analog Devices Inc. (ADI), the gain thereof is controlled by the controller 31, and the programmable gain amplifier is cooperated with the general amplifier 27 to ensure the intensity region of a VGA (Video Graphics Array) output signal satisfies the intensity region of a valid input signal of the A/D converter (ADC) 29. The dynamic gain of a variable gain amplifier is in the range of from −10 DB to +35 DB, and the bandwidth of the variable gain amplifier is 380 MHZ.

The frequency synthesizer (FS) 21 is configured to generate a local oscillator signal.

The mixer 23 is electrically connected to the programmable gain amplifier 19 and the frequency synthesizer 21, and is configured to mix the processed magnetic resonance signal and the local oscillator signal.

The intermediate frequency band-pass filter 25 is electrically connected to the mixer 23, and is configured to filter the mixed magnetic resonance signal.

The general amplifier 27 is configured to amplify the magnetic resonance signal, an input terminal thereof is electrically connected to the intermediate frequency band-pass filter 25, and an output terminal thereof is electrically connected to the A/D converter 29.

The analog to digital converter (ADC) 29 is configured to convert the mixed magnetic resonance signal into a magnetic resonance digital signal, and transmit the magnetic resonance digital signal to the controller 31.

In particular, according to Nyquist sampling theorem, a sampling frequency $f_s$ must be twice greater than the highest frequency of a sampled signal, so that it can restore the sampled signal without distortion. To ensure the sampling frequency $f_s$ of the ADC in the radio frequency receiver is twice greater than the resonance frequency $f_{FID}$ of the magnetic resonance signal, and in order to further reduce a quantization noise of the ADC, the magnetic resonance signal is sampled in the illustrated embodiment. Because an analog mixing process is added before the analog signal enters the ADC, the center frequency of each magnetic resonance signals for different nucleuses or different magnetic field intensities imaging is reduced to below 10M by an $f_L$. The mixing process makes a sampling frequency of 20M finely satisfies Nyquist sampling theorem. An oversampling is used in order to reduce the quantization noise of the ADC, when the sampling frequency is configured to be 10 to 20 times as much as the $f_L$, the present ADC can completely satisfy the sampling requirement. In the illustrated embodiment, AD6644 can be used.

The controller 31 is electrically connected to the multiplexer 15, the radio frequency band-pass filter 17, the frequency synthesizer 21, and the A/D converter 29, separately, so as to control the multiplexer 15 to select the corresponding radio frequency coil channel and the corresponding filter channel, to control the gain of the radio frequency band-pass filter 17, to control the frequency synthesizer 21 to generate the local oscillator signal, and to receive the magnetic resonance digital signal transmitted by the A/D converter 29.

The controller 31 receives an external clock signal and a control command of a magnetic resonance imaging (MRI) mainframe 35, and controls each modular circuit. The controller 31 is a field programmable gate array (FPGA). Each modular circuit includes the multiplexer 15, the radio frequency band-pass filter 17, and the frequency synthesizer.

The controller 31 transmits the magnetic resonance digital signal to the magnetic resonance imaging mainframe 35 through a PCI (Peripheral Component Interconnect) 33 to rebuild an image. The controller 31 can also store the magnetic resonance digital signal in a pseudo static random access memory.

In alternative embodiments, in the radio frequency receiver, the intermediate frequency band-pass filter 25 and the general amplifier 27 can be omitted. The mixer 23 is electrically connected to the A/D converter 29, and transmits the mixed magnetic resonance signal to the A/D converter 29 to implement analog to digital convert.

Figure 2:
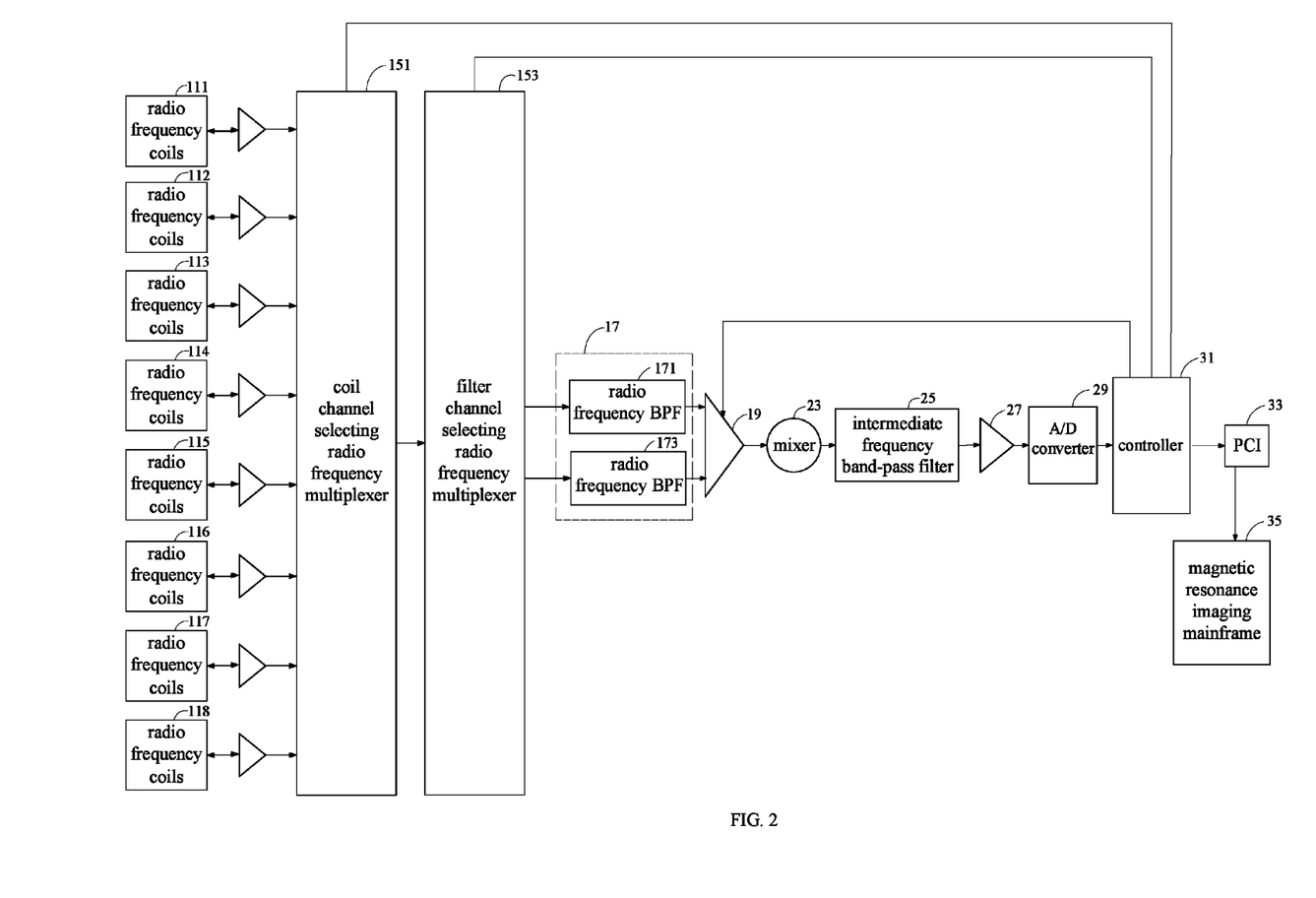
FIG. 2 is a block diagram of a radio frequency receiver of the magnetic resonance multi-core array radio frequency device in accordance with an embodiment.

Furthermore, FIG. 2 is a block diagram of the radio frequency receiver of the magnetic resonance multi-core array radio frequency device. In the figure, eight radio frequency coils 111 to 118 are shown, each radio frequency coil is connected to one channel of the coil channel selecting radio frequency multiplexer 151, and each radio frequency coil and each channel provide with one low noise amplifier 13 therebetween, respectively. The radio frequency receiver can receive different magnetic resonance signals. For example, by selecting the radio frequency coil 111 and the radio frequency band-pass filter 173 for filtering a 19F nucleus at the same time, the radio frequency receiver can receive a magnetic resonance signal of 19F nucleus from the radio frequency coil 111. By selecting the radio frequency coil 113 and the radio frequency band-pass filter 173 for filtering a 19F nucleus at the same time, the radio frequency receiver can receive a magnetic resonance signal of 19F nucleus from the radio frequency coil 113. And by selecting the radio frequency coil 111 and the radio frequency band-pass filter 171 for filtering a 1H nucleus at the same time, the radio frequency receiver can receive a magnetic resonance signal of 1H nucleus from the radio frequency coil 111.

The radio frequency transmitter consists of the frequency synthesizer 21, a buffer amplifier 37, a power amplifier 39, a power detector 41, a transmit/receive switch 43, and the radio frequency coils 11.

The frequency synthesizer 21 is further configured to generate a radio frequency pulse signal.

In addition, the frequency synthesizer 21 is further configured to generate an FPGA digital frequency conversion local oscillator signal. The superimposed frequencies of the local oscillator signal and the FPGA digital frequency conversion local oscillator signal equal to the frequency of the radio frequency pulse signal, so that the phase difference between the radio frequency receiver and the radio frequency transmitter is well restrained.

The buffer amplifier 37 (BA) is electrically connected to the frequency synthesizer 21, and is configured to buffer amplify the radio frequency pulse signal.

The power amplifier 39 is electrically connected to the buffer amplifier 37, and is configured to amplify the radio frequency pulse signal. In particular, the power amplifier 39 is a high power amplifier (HPA) of AGILENT.

The power detector 41 (PD) is electrically connected to the power amplifier 39 and the controller 31, and is configured to adjust the power of the radio frequency pulse signal. In particular, after the transmitting power is detected by the power detector 41, the power amplifying and the gain of the power detector 41 is adjusted to regulate the power of the radio frequency pulse signal.

One end of the transmit/receive switch 43 is connected to the radio frequency coils 11, and the other end of the transmit/receive switch 43 is connected to the low noise amplifier 13 and the power detector 41, respectively.

The radio frequency coils 11 are further configured to transmit radio frequency pulse signal.

When the radio frequency transmitter is working, the transmit/receive switch 43 is configured to a transmit state, the magnetic resonance imaging mainframe sends command to the controller 31 of the radio frequency transmitter (such as FPGA) through PCI, so as to transmit a certain radio frequency pulse that satisfies the requirement. And the controller 31 controls the frequency synthesizer 21 to generate a radio frequency pulse signal, the radio frequency pulse signal goes through the buffer amplifier 37, enters the radio frequency coils 11 via the power amplifier 39 and the power detector 41 to excite the corresponding nucleus of a tested object.

When the radio frequency receiver is working, the transmit/receive switch 43 is configured to a receive state, the radio frequency coils 11 capture a magnetic resonance signal, and the magnetic resonance signal is amplified by the low noise amplifier 13, the coil channel selecting radio frequency multiplexer 151 and the filter channel selecting radio frequency multiplexer 153 select the corresponding channels, and the magnetic resonance signal is filtered by the radio frequency band-pass filter 17, then amplified by the programmable gain amplifier 19; the mixer 23 mixes the local oscillator signal generated by the frequency synthesizer 21 and the magnetic resonance signal, and then the mixed magnetic resonance signal is filtered by the intermediate frequency band-pass filter 25, amplified by the general amplifier 27, so that the magnetic resonance signal reaches the receiving range of the A/D converter 29, and the magnetic resonance signal is converted by the A/D converter 29 to the magnetic resonance digital signal, the magnetic resonance digital signal is transmitted by the controller 31 to the magnetic resonance imaging mainframe 35 to rebuild the image.

Figure 3:
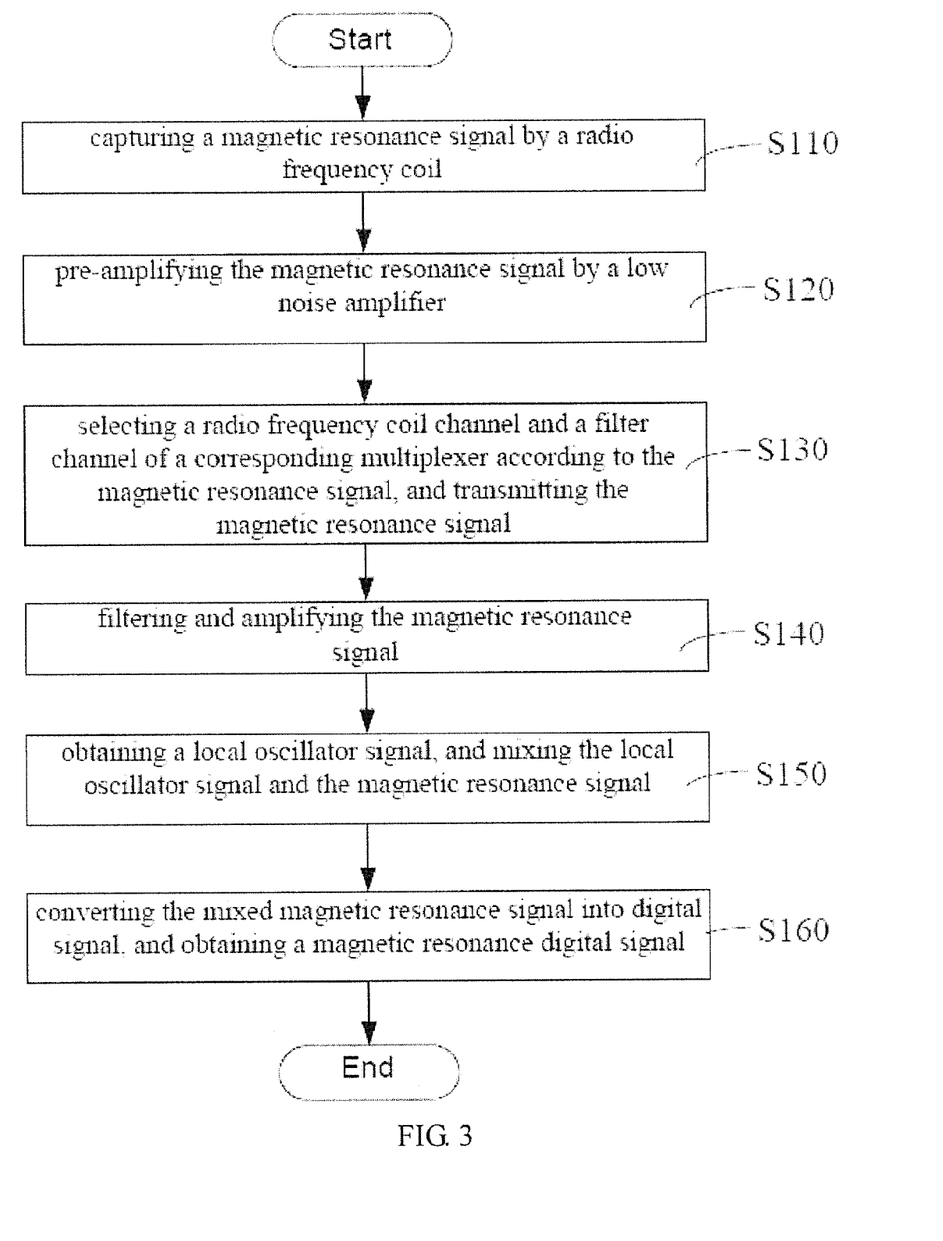
FIG. 3 is a flow chart of a magnetic resonance signal receiving method in accordance with an embodiment.

Referring to FIG. 3, in an embodiment, a magnetic resonance signal receiving method includes the following steps:

Step S110, a magnetic resonance signal is captured by a plurality of radio frequency coils.

In the illustrated embodiment, the radio frequency coils are receiving and transmitting terminals of a magnetic resonance multi-core array radio frequency device, the radio frequency coils may be multichannel phased array coils, combined coils, or body coils. Alternatively, the radio frequency coils 11 may also be radio frequency coils that can be automatically tuned according to different nucleuses imaging or radio frequency coils that can be tuned for different field intensities. The radio frequency coils can capture a magnetic resonance signal.

In an embodiment, prior to Step S110, the method further includes a step: a transmit/receive switch is configured to a receive state.

Step S120, the captured magnetic resonance signal is pre-amplified by a low noise amplifier.

In particular, the gain of the low noise amplifier is 30 DB, and the noise figure thereof is 0.5 DB, the low noise amplifier can amplify a magnetic resonance signal in milliamps level, which facilitates the following circuit processing. The low noise amplifier is tightly connected to the radio frequency coils.

Step S130, a corresponding radio frequency coil channel of a multiplexer and a corresponding filter channel are selected according to the magnetic resonance signal, and the magnetic resonance signal is transmitted.

In an embodiment, the radio frequency receiver includes multiple low noise amplifiers, each channel of a multiplexer and each radio frequency coil provide with one low noise amplifier there between, separately. For example, the multiplexer may be an 8-to-1 multiplexer of Mini-Circuits Co. Ltd, whose rise time and fall time is 3 ns. Each low noise amplifier is independently shielded. The eight branches of the multiplexer are also electromagnetically shielded independently, so as to avoid the electromagnetic interference and the coupling therebetween.

In an embodiment, the multiplexer includes a coil channel selecting radio frequency multiplexer and a filter channel selecting radio frequency multiplexer. The coil channel selecting radio frequency multiplexer is electrically connected to the low noise amplifier, and is configured to provide and select a radio frequency coil channel. The filter channel selecting radio frequency multiplexer is configured to provide and select a filter channel, an input terminal thereof is electrically connected to the coil channel selecting radio frequency multiplexer, and an output terminal thereof is electrically connected to a radio frequency band-pass filter.

Step S140, the magnetic resonance signal is filtered and amplified.

In particular, the magnetic resonance signal is filtered by the radio frequency band-pass filter to eliminate the noise, and avoid a spectrum aliasing during sampling. In the illustrated embodiment, a surface-mount BPF of Mini-Circuits Co. Ltd is used to obtain a band-pass filtering of 120 MHZ and 128 MHZ, respectively, and the bandwidth of the surface-mount BPF is 1 MHZ. In an embodiment, the radio frequency receiver includes multiple radio frequency band-pass filters, each input terminal of each radio frequency band-pass filter is electrically connected to the filter channel selecting radio frequency multiplexer, and each output terminal of each radio frequency band-pass filter is electrically connected to a programmable gain amplifier. In the illustrated embodiment, the radio frequency band-pass filter includes a radio frequency band-pass filter configured to filter a 1H nucleus and a radio frequency band-pass filter configured to filter a 19F nucleus.

The programmable gain amplifier (PGA) is configured to amplify the magnetic resonance signal.

Step S150, a local oscillator signal is obtained, and the local oscillator signal and the magnetic resonance signal are mixed.

In particular, the local oscillator signal is generated by a frequency synthesizer. A mixer mixes the local oscillator signal and the magnetic resonance signal.

In an embodiment, after Step S150, the method further includes a step: the mixed magnetic resonance signal is filtered and amplified.

A general amplifier is configured to amplify the magnetic resonance signal.

Step S160, A/D converting the mixed magnetic resonance signal, and obtaining a magnetic resonance digital signal.

In particular, an A/D convertor is configured to convert the mixed magnetic resonance signal and obtain the magnetic resonance digital signal.

In the magnetic resonance multi-core array radio frequency device and the magnetic resonance signal receiving method, a multiplexer is configured to select a corresponding radio frequency coil channel and a corresponding filter channel, while other circuits are communal, so it is not necessary to configure different circuits for different magnetic resonance nucleuses, which reduces the redundancy of the circuits, and cuts the cost.

In addition, the radio frequency transmitter and the radio frequency receiver are integrated, a phase coherence between the transmitting and the receiving is eliminated because the receiving frequency changes according to the change of the transmitting frequency; the combination of the multiplexer and the radio frequency filters enables the receiver to receive magnetic resonance signals of a plurality of nucleuses, such as magnetic resonance signals of 1H nucleus and 19F nucleus.

Furthermore, a receiving and transmitting function of an all-digital radio frequency signal is implemented, with well universal property, low cost, high precision, and high speed in receiving and transmitting. By using an FPGA to control the frequency synthesizer and the power amplifier, the signal transmitting frequency, the range, and the power of the magnetic resonance multi-core array radio frequency device are tunable. By using the FPGA to control the radio frequency band-pass filter, the multiplexer, and the frequency synthesizer, and combining with a digital orthogonal frequency convert technique of the FPGA soft-core, the universal property of the receiver is increased, and the receiver is applied to a digital receiving for magnetic resonance signals of different nucleuses. The dynamic receiving range of the whole receiver is greatly increased by using a variable gain technique.

The embodiments described above only show a few implement manners of the present invention, the description is specific and detailed, but it cannot be interpreted as a limitation of the range of the present invention. What should be pointed out is that it is apparent to those skilled in the art that a variety of modifications and changes may be made without departing from the scope of the present invention. Thus, the range of the present invention should be defined by the appended claims.

What is claimed is:

1. A magnetic resonance multi-core array radio frequency device, comprising a radio frequency receiver, wherein the radio frequency receiver comprises:
    a plurality of radio frequency coils configured to capture a magnetic resonance signal;
    a low noise amplifier electrically connected to the radio frequency coils, and configured to pre-amplify the magnetic resonance signal captured by the radio frequency coils;
    a multiplexer electrically connected to the low noise amplifier, and configured to provide a corresponding radio frequency coil channel and a corresponding filter channel, and transmit the magnetic resonance signal pre-amplified by the low noise amplifier;
    a radio frequency band-pass filter electrically connected to the multiplexer, and configured to filter the magnetic resonance signal;
    a programmable gain amplifier electrically connected to the radio frequency band-pass filter, and configured to amplify the magnetic resonance signal;
    a frequency synthesizer configured to generate a local oscillator signal;
    a mixer electrically connected to the programmable gain amplifier and the frequency synthesizer, and configured to mix the magnetic resonance signal and the local oscillator signal;
    an A/D converter electrically connected to the mixer, and configured to convert the magnetic resonance signal mixed by the mixer into a magnetic resonance digital signal; and
    a controller electrically connected to the multiplexer, the radio frequency band-pass filter, the frequency synthesizer, and the A/D converter, respectively, the controller is configured to control the multiplexer to select the corresponding radio frequency coil channel and the corresponding filter channel, to control a gain of the radio frequency band-pass filter, to control the frequency synthesizer to generate the local oscillator signal and receive the magnetic resonance digital signal transmitted by the A/D converter.

2. The magnetic resonance multi-core array radio frequency device according to claim 1, wherein the frequency synthesizer is further configured to generate a radio frequency pulse signal, and the magnetic resonance multi-core array radio frequency device further comprises:
    a buffer amplifier electrically connected to the frequency synthesizer, and configured to buffer amplify the radio frequency pulse signal;
    a power amplifier electrically connected to the buffer amplifier, and configured to amplify the radio frequency pulse signal;
    a power detector electrically connected to the power amplifier and the controller, and configured to adjust a power of the radio frequency pulse signal; and
    a transmit/receive switch, wherein one end of the transmit/receive switch is connected to the radio frequency coils, and the other end of the transmit/receive switch is connected to the low noise amplifier and the power detector, respectively;
    the radio frequency coils are further configured to transmit the radio frequency pulse signal;
    wherein the frequency synthesizer, the buffer amplifier, the power amplifier, the power detector, the transmit/receive switch, and the radio frequency coils cooperatively form a radio frequency transmitter.

3. The magnetic resonance multi-core array radio frequency device according to claim 1, wherein the multiplexer comprises:
    a coil channel selecting radio frequency multiplexer electrically connected to the low noise amplifier, and configured to provide the radio frequency coil channel; and
    a filter channel selecting radio frequency multiplexer configured to provide the filter channel, wherein an input terminal thereof is electrically connected to the coil channel selecting radio frequency multiplexer, and an output terminal thereof is electrically connected to the radio frequency band-pass filter.

4. The magnetic resonance multi-core array radio frequency device according to claim 3, wherein the number of the radio frequency band-pass filter is multiple, each input terminal of each radio frequency band-pass filter is electrically connected to the filter channel selecting radio frequency multiplexer, and each output terminal of each radio frequency band-pass filter is electrically connected to the programmable gain amplifier.

5. The magnetic resonance multi-core array radio frequency device according to claim 3, wherein the number of the low noise amplifier is multiple, each low noise amplifier is disposed between each channel of the coil channel selecting radio frequency multiplexer and the radio frequency coils.

6. The magnetic resonance multi-core array radio frequency device according to claim 1, wherein the radio frequency coils are selected from the group consisting of multi-channel phased array coils, combined coils, body coils, and tunable radio frequency coils.

7. The magnetic resonance multi-core array radio frequency device according to claim 1, further comprising:
    an intermediate frequency band-pass filter electrically connected to the mixer, and configured to filter the magnetic resonance signal mixed by the mixer; and a general amplifier configured to amplify the magnetic frequency signal, wherein an input terminal thereof is electrically connected to the intermediate frequency band-pass filter, and an output terminal thereof is electrically connected to the A/D converter.

8. The magnetic resonance multi-core array radio frequency device according to claim 2, wherein the multiplexer comprises:

a coil channel selecting radio frequency multiplexer electrically connected to the low noise amplifier, and configured to provide the radio frequency coil channel; and a filter channel selecting radio frequency multiplexer configured to provide the filter channel, wherein an input terminal thereof is electrically connected to the coil channel selecting radio frequency multiplexer, and an output terminal thereof is electrically connected to the radio frequency band-pass filter.

9. The magnetic resonance multi-core array radio frequency device according to claim 8, wherein the number of the radio frequency band-pass filter is multiple, each input terminal of each radio frequency band-pass filter is electrically connected to the filter channel selecting radio frequency multiplexer, and each output terminal of each radio frequency band-pass filter is electrically connected to the programmable gain amplifier.

10. The magnetic resonance multi-core array radio frequency device according to claim 8, wherein the number of the low noise amplifier is multiple, each low noise amplifier is disposed between each channel of the coil channel selecting radio frequency multiplexer and the radio frequency coils.

11. A method of receiving magnetic resonance signal, comprising the following steps:

capturing a magnetic resonance signal by a radio frequency coil;

pre-amplifying the magnetic resonance signal by a low noise amplifier;

selecting a corresponding radio frequency coil channel of a multiplexer and a corresponding filter channel according to the magnetic resonance signal, and transmitting the magnetic resonance signal;

filtering and amplifying the magnetic resonance signal;

obtaining a local oscillator signal, and mixing the local oscillator signal and the magnetic resonance signal; and converting the mixed magnetic resonance signal into a digital signal, and obtaining a magnetic resonance digital signal.

12. The method according to claim 11, wherein prior to the step of capturing a magnetic resonance signal by a radio frequency coil, the method further comprises:

configuring a transmit/receive switch to a receive state.

13. The method according to claim 11, wherein after the step of obtaining a local oscillator signal, and mixing the local oscillator signal and the magnetic resonance signal, the method further comprises:

filtering and amplifying the mixed magnetic resonance signal.

* * * * *